United States Patent
Shiao et al.

(10) Patent No.: US 7,646,216 B2
(45) Date of Patent: Jan. 12, 2010

(54) LOW POWER MODE

(75) Inventors: Wilma Waiman Shiao, San Jose, CA (US); Stephen U. Yao, Markham (CA); Ket-Chong Yap, San Ramon, CA (US)

(73) Assignee: QuickLogic Corporation, Sunnyvale, CA (US)

( * ) Notice: Subject to any disclaimer, the term of this patent is extended or adjusted under 35 U.S.C. 154(b) by 471 days.

(21) Appl. No.: 11/563,632

(22) Filed: Nov. 27, 2006

(65) Prior Publication Data

US 2008/0122483 A1    May 29, 2008

(51) Int. Cl.
G06F 7/38 (2006.01)
H03K 19/173 (2006.01)
H03K 19/177 (2006.01)
H01L 25/00 (2006.01)

(52) U.S. Cl. .................. 326/38; 326/37; 326/39; 326/41; 326/47

(58) Field of Classification Search .............. 326/38
See application file for complete search history.

(56) References Cited

U.S. PATENT DOCUMENTS

| | | | |
|---|---|---|---|
| 5,196,724 A | 3/1993 | Gordon et al. | |
| 5,243,226 A | 9/1993 | Chan | |
| 5,327,024 A | 7/1994 | Cox | |
| 5,362,676 A | 11/1994 | Gordon et al. | |
| 5,424,655 A | 6/1995 | Chua | |
| 5,477,167 A | 12/1995 | Chua | |
| 5,502,315 A | 3/1996 | Chua et al. | |
| 5,717,230 A | 2/1998 | Chua et al. | |
| 5,825,201 A | 10/1998 | Kolze | |
| 6,127,845 A | 10/2000 | Kolze et al. | |
| 6,426,649 B1 | 7/2002 | Fu et al. | |
| 6,552,957 B2 * | 4/2003 | Yagishita | 365/233.1 |
| 6,985,374 B2 * | 1/2006 | Yamamura | 365/145 |
| 2005/0091630 A1 * | 4/2005 | Madurawe | 716/16 |

OTHER PUBLICATIONS

"Deep sleep mode cuts FPGA power", Electronics Weekly, Nov. 8, 2005 (1 page) downloaded from http://www.electronicsweekly.com/.

* cited by examiner

*Primary Examiner*—Vibol Tan
*Assistant Examiner*—Matthew C Tabler

(57) ABSTRACT

An apparatus and method of reducing power consumption across a switch, such as an unprogrammed antifuse, is provided. The invention applies to antifuses, other switches such as transistor based switches, (e.g., FLASH, EEPROM and/or SRAM) and other devices exhibiting a leakage current, especially during a sleep or stand-by mode. During a sleep mode, such switches or other devices may be uncoupled from signals driving the switches, then terminals of each switch may be coupled to a common potential or allowed to float to a common potential thereby eliminating or reducing leakage currents through the switches.

26 Claims, 5 Drawing Sheets

LOW POWER MODE

CROSS-REFERENCE TO RELATED APPLICATIONS

Not applicable.

BACKGROUND OF THE INVENTION

1. Field of the Invention

The invention relates to programmable logic modules and in particular to low power modes, for example, in a field-programmable gate arrays (FPGA) or in a programmable application specific integrated circuit (pASIC).

2. Background of the Invention

A programmable device is a versatile integrated circuit chip, the internal circuitry of which may be configured by an individual user to realize a user-specific circuit. Programmable devices include configurable logic sometimes referred to as field-programmable gate arrays (FPGA), programmable application specific integrated circuits (pASIC), logic cell array (LCA), programmable logic devices (PLD), and complex programmable logic devices (CPLD). To configure a programmable device, the user configures an on-chip interconnect structure of the programmable device so that selected input terminals and selected output terminals of selected on-chip circuit components are electrically connected together in such a way that the resulting circuit is the user-specific circuit desired by the user.

In a programmable device employing, for example, amorphous silicon antifuses, selected amorphous silicon antifuses disposed between selected wire segments are "programmed" to connect the selected wire segments together electrically. Which antifuses are programmed and which antifuses are left unprogrammed determines how the circuit components are interconnected and therefore determines the resulting functionality of the circuit. For background information on programmable devices employing antifuses, see, e.g.: U.S. Pat. No. 5,424,655 entitled "Programmable application specific integrated circuit employing antifuses and methods therefor"; U.S. Pat. No. 5,825,201 entitled "Programming architecture for a programmable integrated circuit employing antifuses"; and U.S. Pat. No. 6,426,649 entitled "Architecture for field programmable gate array." The contents of these documents are incorporated herein by reference.

A programmable device may include a plurality of antifuse switches, both programmed and unprogrammed. A potential placed across an unprogrammed switch may result in an unnecessary leakage current. A programmed device having tens, hundreds, thousands or more of such unprogrammed antifuses may encounter a sizable cumulative leakage current during use. Such a total leakage current may be undesired in active as well as stand-by or sleep modes. Therefore, a need exists to reduce unnecessary leakage currents in programmable devices.

SUMMARY

An apparatus and method of reducing power consumption across a switch, such as an unprogrammed antifuse, is provided. The invention applies to antifuses, other switches such as transistor based switches, (e.g., FLASH, EEPROM and/or SRAM) and other devices exhibiting a leakage current, especially during a sleep or stand-by mode. During a sleep or stand-by mode, such switches or other devices may be uncoupled from all or all but a single signals, then terminals of each switch may be coupled to a common potential thereby eliminating or reducing leakage currents through the open switches.

Some embodiments of the present invention provide for a programmable logic device comprising: (a) a switch array comprising a plurality of switches each having a first terminal coupled to one of a plurality of columns and a second terminal couple to one of a plurality of rows; (b) interface logic comprising input logic operable to provide one or more signals to the switch array, wherein the input logic comprises a first plurality of gates having a first terminal coupled to one or more of the plurality of switches; and an associated plurality of input buffers each one coupled to a second terminal of a respective one of the first plurality of gates; (c) sleep mode gates comprising a second plurality of gates each one having a first terminal coupled to a respective one of the plurality of columns and having a second terminal coupled to a common potential source; and a third plurality of gates each one having a first terminal coupled to a respective one of the plurality of rows and having a second terminal coupled to the common potential source; and (d) sleep mode control logic coupled to a control terminal of each gate of the first, second and third pluralities of gates.

Some embodiments of the present invention provide for a method of processing a sleep mode, the method comprising: (a) receiving a control signal to enter a sleep mode; (b) electrically decoupling a switch array from input logic with a first plurality of gates, wherein the switch array comprises a plurality of switches each having a first terminal coupled to one of a plurality of columns and a second terminal couple to one of a plurality of rows, and wherein the input logic is operable to provide one or more signals to the switch array; (c) electrically coupling a first terminal from a second terminal for each of a second plurality of gates, wherein the first terminal is coupled to a respective one of the pluralities of columns and wherein the second terminal is coupled to a common potential source; and (d) electrically coupling a first terminal from a second terminal for each of a third plurality of gates, wherein the first terminal is coupled to a respective one of the pluralities of rows and wherein the second terminal is coupled to the common potential source.

Some embodiments of the present invention provide for a programmable logic device comprising: (a) a switch array comprising a plurality of switches each having a first terminal coupled to one of a plurality of columns and a second terminal couple to one of a plurality of rows; (b) interface logic comprising input logic operable to provide one or more signals to the switch array, wherein the input logic comprises a first plurality of gates having a first terminal coupled to one or more of the plurality of switches; and an associated plurality of input buffers each one coupled to a second terminal of a respective one of the first plurality of gates; output logic operable to accept one or more signals from the switch array, wherein the output logic comprises a plurality of output gates each having an input terminal coupled to one or more of the plurality of switches and each having an output terminal; and an associated plurality of output buffers each one coupled to the output terminal of a respective one of the plurality of output gates; and (c) sleep mode control logic coupled to a control terminal of each gate of the first plurality of gates and to a control terminal of each of the plurality of output gates.

Some embodiments of the present invention provide for a method of entering a sleep mode, the method comprising: (a) receiving a control signal to enter the sleep mode; and (b) electrically decoupling input logic from a switch array with a first plurality of gates, wherein the switch array comprises a plurality of switches each having a first terminal coupled to one of a plurality of columns and a second terminal couple to one of a plurality of rows, and wherein the input logic is operable to provide one or more signals to the switch array.

These and other aspects, features and advantages of the invention will be apparent by reference to the embodiments described hereinafter.

BRIEF DESCRIPTION OF THE DRAWINGS

Embodiments of the invention will be described, by way of example only, with reference to the drawings.

DETAILED DESCRIPTION OF THE INVENTION

In the following description, reference is made to the accompanying drawings, which illustrate several embodiments of the present invention. It is understood that other embodiments may be utilized and mechanical, compositional, structural, electrical, and operational changes may be made without departing from the spirit and scope of the present disclosure. The following detailed description is not to be taken in a limiting sense. Furthermore, some portions of the detailed description that follows are presented in terms of procedures, steps, logic blocks, processing, and other symbolic representations of operations on data bits that can be performed in electronic circuitry or on computer memory. A procedure, computer executed step, logic block, process, etc., are here conceived to be a self-consistent sequence of steps or instructions leading to a desired result. The steps are those utilizing physical manipulations of physical quantities.

Figure 1A:
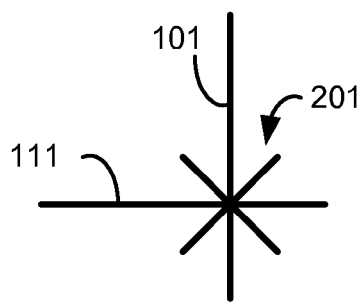
FIGS. 1A, 1B, 2A, 2B, 3A and 3B illustrate various states of an antifuse switch known in the prior art.
Figure 1B:
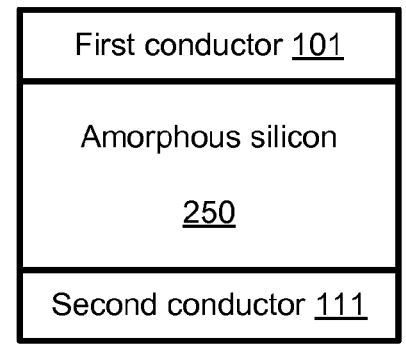
Figure 2A:
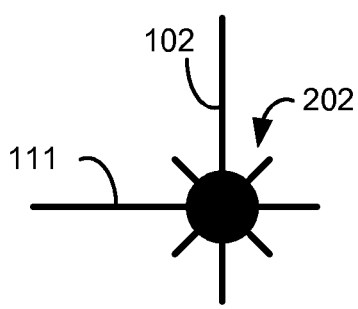
Figure 2B:
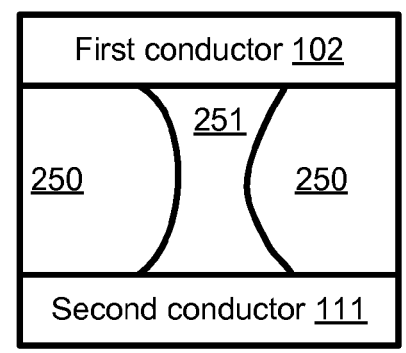
Figure 3A:
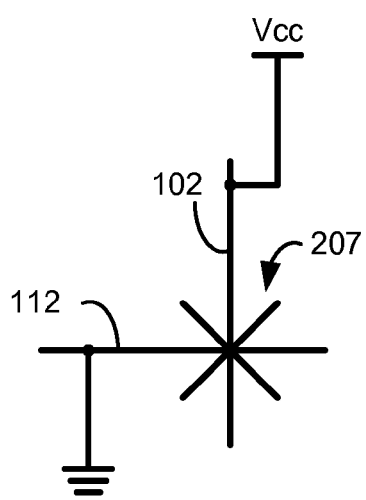
Figure 3B:
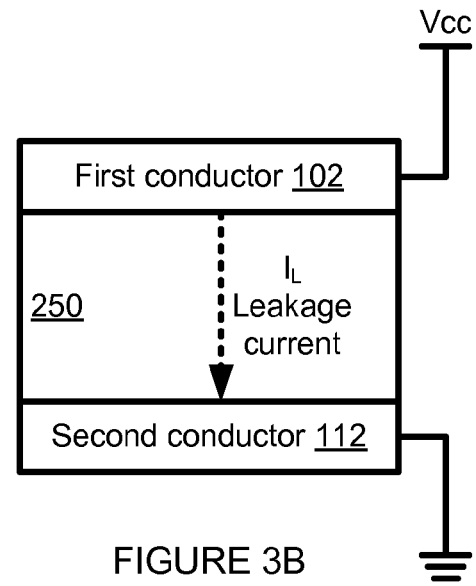

FIGS. 1A, 1B, 2A, 2B, 3A and 3B illustrate various states of an antifuse switch. FIGS. 1A, 2A and 3A show schematic representations whereas FIGS. 1B, 2B and 3B illustrate physical representations of the antifuses.

FIGS. 1A and 1B illustrate an antifuse 201 that is not programmed, i.e., configured to insulate. Antifuse 201 includes a first conductor 101 includes a metal layer and acts as a first electrode and a second conductor 111 including a metal layer and acts as a second electrode. Antifuse 201 also includes a material such as an amorphous silicon 250 separating and in contact with first conductor 101 and second conductor 111. Material 250 insulates first conductor 101 and second conductor 111 when antifuse 201 is un-programmed. When un-programmed, the antifuse is designed to provide a non-conducting insulator between first conductor 101 and second conductor 111. For further descriptions of antifuses, see, e.g., U.S. Pat. No. 5,196,724 titled "Programmable interconnect structures and programmable integrated circuits" and U.S. Pat. No. 5,362,676 titled "Programmable interconnect structures and programmable integrated circuits", both incorporated herein by reference.

FIGS. 2A and 2B illustrate an antifuse 202 that has been programmed, i.e., configured to conduct. Similarly, antifuse 202 includes a first conductor 102 and a second conductor 111 acting as electrodes and also includes a material such as an amorphous silicon 250 separating first conductor 102 and second conductor 111. Material 250 has been programmed to transform insulating material 250 into conducting material 251. When programmed, the antifuse is designed to provide a low resistance between first conductor 102 and second conductor 111 via conducting material 251. Typically, the programmed resistance may be approximately between 500 ohms and 9 ohms. For further descriptions of antifuses and programming antifuses, see, e.g., U.S. Pat. No. 5,243,226 titled "Programming of antifuses" and U.S. Pat. No. 5,327,024 titled "Field programmable antifuse device and programming method therefore", both incorporated herein by reference.

FIGS. 3A and 3B illustrate a leakage current IL in an un-programmed antifuse 207 of an active circuit. Again, antifuse 207 includes a first conductor 102 and a second conductor 112 acting as electrodes and an insulating material 250 separating first conductor 102 and second conductor 112. First conductor 102 is coupled to a source at a first potential $V_{cc}$, for example, having a value between 1.2 volts and 5.5 volts such as 1.8 volts. Second conductor 112 is coupled to a source at a second potential, for example, a reference ground at 0 volts.

When the first and second potentials are different, a non-zero potential exists across insulating material 250. Ideally, since antifuse 207 is not programmed, material 250 should electrically isolate first conductor 102 from second conductor 112. Practically, however, material 250 is not a perfect insulator and therefore allows a small but finite leakage current $I_L$ to pass between first conductor 102 and second conductor 112 via a path through un-programmed material 250 when a potential is applied. Improved structural designs have been introduced to reduce leakage currents. For example, some antifuses include dimensions or are fabricated such that the un-programmed resistance through material 250 is in a high resistive state (e.g., over 550 Mega Ohms) and an operational leakage current $I_L$ through the un-programmed antifuses is very low (e.g., about 10 nano Amperes or less at 5.5 volts). For additional discussions of leakage currents in an un-programmed antifuse see, e.g., U.S. Pat. No. 5,196,724 titled "Programmable interconnect structures and programmable integrated circuits", U.S. Pat. No. 5,502,315 titled "Electrically programmable interconnect structure having a PECVD amorphous silicon element", and U.S. Pat. No. 5,717,230 titled "Field programmable gate array having reproducible metal-to-metal amorphous silicon antifuses", each of which is incorporated herein by reference.

A large number of un-programmed, such as antifuse 207, may be incorporated in a circuit. For example, one or more arrays or matrixes of antifuse may be formed by placing antifuses at intersections of columns and rows. In a typical operating configuration, most of the antifuses are un-programmed and only a small percentage are programmed. For a further description of circuitry including arrays of antifuses, see, e.g., U.S. Pat. No. 5,477,167 titled "Programmable application specific integrated circuit using logic circuits to program antifuses therein", which is incorporated herein by reference.

Even though a single un-programmed antifuse 207 having a non-zero potential across its electrodes may contribute a negligible power loss in a circuit, an array of such antifuses may result in substantial losses through the combined leakage currents of many un-programmed antifuse. This loss is especially noticeable once the circuitry is no longer in a mode consuming higher power, such as a programming mode or operational mode, and has entered a low power mode, such as a sleep or standby mode. In some circuitry having arrays of antifuse switches, the total standby current consumption can be up to approximately a few hundred microamperes to a few milliamperes over the 0-70 degrees Celsius range, all of this current being due to leakage. This standby current drain is highly undesirable for low power and battery applications. For a further description of current consumption of arrays of antifuses, see, e.g., U.S. Pat. No. 6,127,845 titled "Field programmable gate array having internal logic transistors with two different gate insulator thicknesses" and U.S. Pat. No. 6,127,845 titled "Field programmable gate array having internal logic transistors with two different gate insulator thicknesses".

FIGS. 4A, 4B, 4C and 5 show sleep mode logic and accompanying circuitry, in accordance with embodiments of the present invention.

Figure 4A:
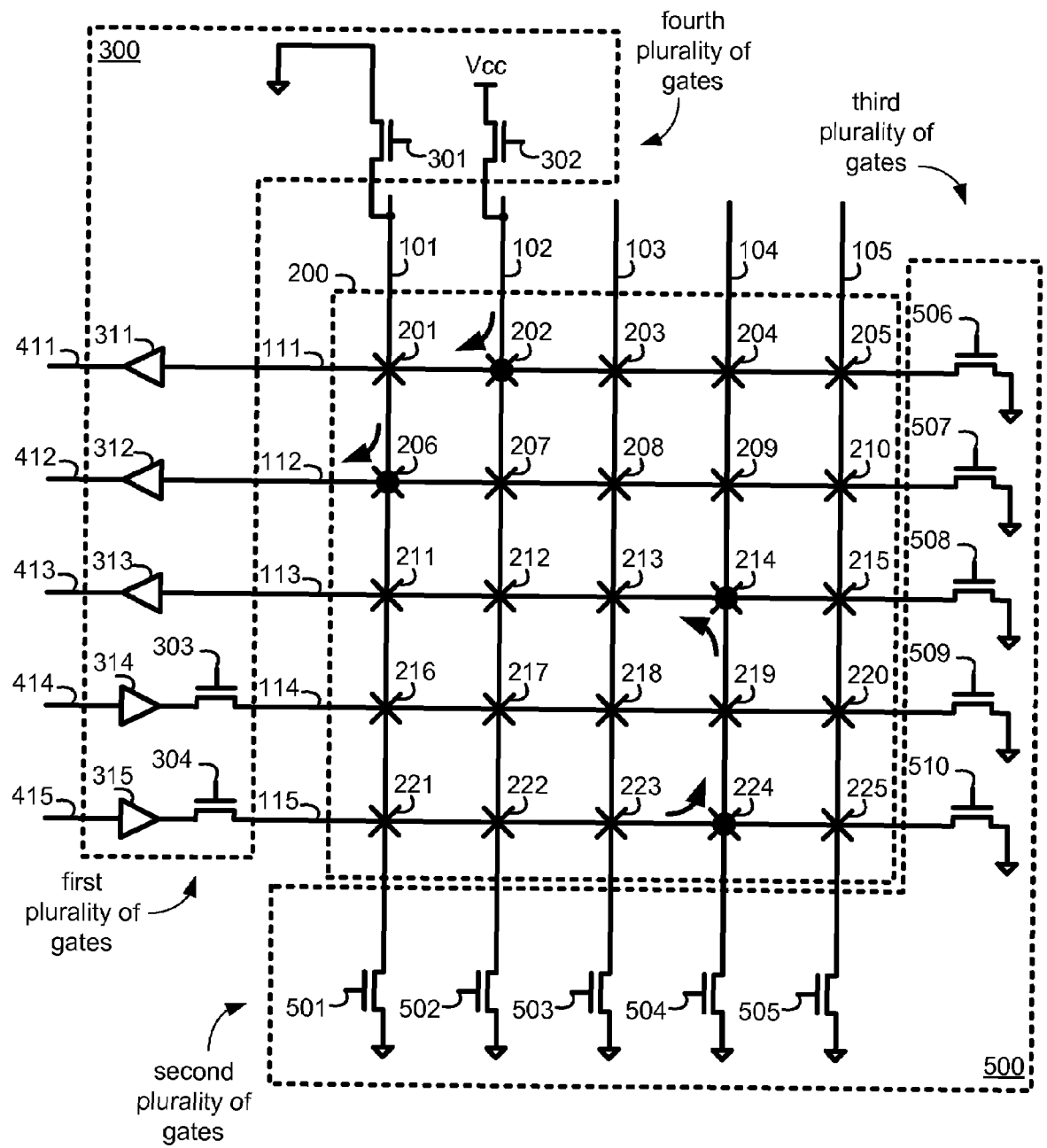
FIGS. 4A, 4B, 4C and 5 show sleep mode logic and accompanying circuitry, in accordance with embodiments of the present invention.

FIG. 4A shows a programmable logic device including a switch array 200, interface logic 300 coupled to functional logic modules 400 (not shown), and sleep mode gates 500. The circuitry shown decouples the input ports of switch array 200 and drives switch array 200 to a common potential as described below.

Switch array 200 includes a plurality of switches 201-225 each having a first terminal coupled to one of a plurality of columns 101-105 and a second terminal couple to one of a plurality of rows 111-115. Switch array 200 may be configured at the physical intersections of the columns 101-105 and rows 111-115 or may be configured at logical intersections of the columns 101-105 and rows 111-115. Switch array 200 may be include a single array or may include disperse arrays of switches. Switches 201-225 may be antifuses. Switches 201-225 may be transistor based switches, such as used in FLASH, EEPROM and/or SRAM.

Interface logic 300 includes input logic operable to provide one or more signals to switch array 200. Input logic includes a first plurality of gates 303, 304 and an associated plurality of input buffers 314, 315. A functional logic module 400 (not shown) provides a signal to terminal 414, which is supplied to buffer 314. Buffer 314 provides its output signal to an input terminal of gate 303. An output terminal of gate 303 supplies an input signal to a plurality of switches 216-220. Similarly, functional logic module 400 (not shown) provides a signal to terminal 415, which is supplied to buffer 315. Buffer 315 provides its output signal to an input terminal of gate 304. An output terminal of gate 304 supplies an input signal to a plurality of switches 221-225.

Interface logic 300 may also include a plurality of output buffers coupled to one or more of the plurality of switches of switch array 200. Each of the plurality of output buffers is operable to accept a signal from a row or a column of switch array 200. For example, output buffer 311 is coupled to row 111 to accept a signal from any of switches 201-205. As shown, switch 202 couples column 102 to row 111 and switches 201 and 203-205 are left uncoupled. Therefore, a signal on column 102 is provided to row 111 and thereby to the input of output buffer 311. An output of output buffer 311 is provided to an output terminal 411.

Similarly, output buffer 312 is coupled to row 112 to accept a signal from any of switches 206-210. As shown, switch 206 couples column 101 to row 112 and switches 207-210 are left uncoupled. Therefore, a signal on column 101 is provided to row 112 and to the input of output buffer 312. An output of output buffer 312 is provided to an output terminal 412.

As shown, output buffer 313 is coupled to row 113 to accept a signal from any of switches 211-215. Switch 214 couples column 104 to row 113 and switches 211-213 and 215 are left uncoupled. In addition, switch 224 couples column 104 to row 115. Therefore, a signal on a row 115, provided by buffer 315 and gate 304, is routed to column 104 then to row 113 and to the input of output buffer 313. An output of output buffer 313 is provided to an output terminal 413.

Sleep mode gates 500 include a second plurality of gates (column gates 501-505) and a third plurality of gates (row gates 506-510). Column gates 501-505 each have a first terminal coupled to a respective one of the plurality of columns and have a second terminal coupled to a common potential source. Gates 506-510 each have a first terminal coupled to a respective one of the plurality of rows and have a second terminal coupled to the same common potential source. The common potential source may be a common ground or other common potential, such as $V_{cc}$. Alternatively, the common potential source may simply be a common conductor that acts as a floating reference.

Interface logic 300 may further include a forth plurality of gates providing one or more logical signals low signals and/or one or more logical high signals to respective columns or rows. As shown, a first gate 301 has a first terminal coupled a source of a logical low signal (e.g., ground) and a second terminal coupled to a single one of the columns or rows, namely column 101. A second gate 302 has a first terminal coupled a source of a logical high signal (e.g., $V_{cc}$) and a second terminal coupled to a single one of the columns or rows, namely column 102. Therefore, if a functional logic module 400 (not shown), requires a predetermined low or high logical signal, an appropriate switch may be set to provide such a signal. For example, output buffer 312 accepts a logical low signal from gate 301 via row 112 coupled through switch 206 to column 101. Similarly, output buffer 311 accepts a logical high signal from gate 302 via row 111 coupled through switch 202 to column 102.

Figure 4B:
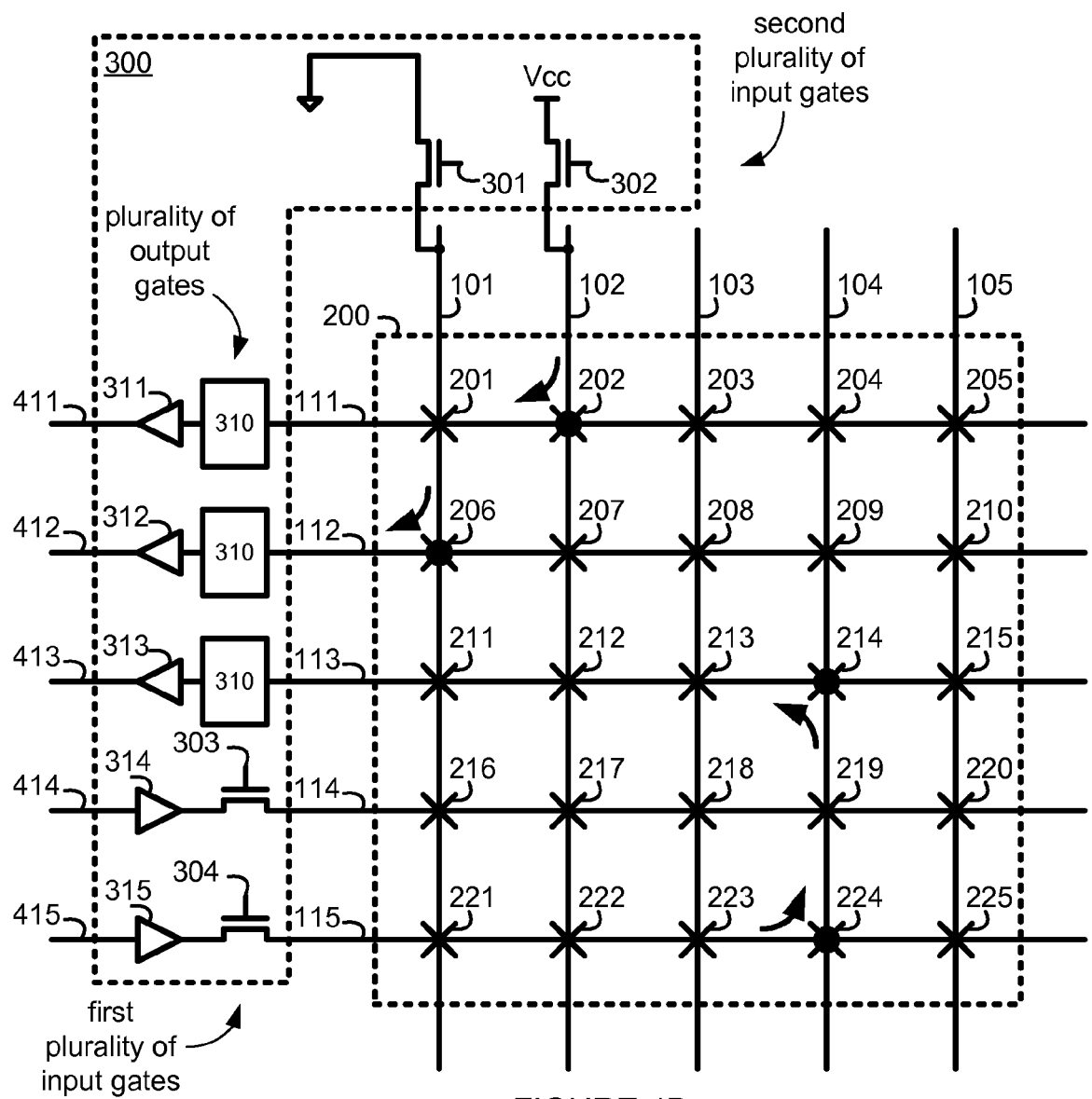

FIG. 4B shows a programmable logic device including a switch array 200 and interface logic 300 coupled to functional logic modules 400 (not shown), in accordance with other embodiments of the present invention. The embodiment of FIG. 4B decouples both input ports of switch array 200 from active-mode signals. In some embodiments, the output ports are also decoupled from switch array 200. In this embodiment, optionally sleep mode gates 500 are omitted. When no input signals are supplied to switch array 200, the columns and rows of switch array 200 float to a potentially indeterminate common potential. On the other hand, when only one signal potenal is provided as one or more input signal sources to switch array 200, the columns and rows of switch array 200 may be driven to a known common potential.

If all of the signal sources are decoupled from switch array 200, the common potential maybe indefinite and may float somewhere in between zero and $V_{cc}$ volts. In this case, output drivers or buffers (e.g., 311, 312 and 313) may be supplied with a signal that is between a logical high and a logical low. Some devices, such as CMOS buffers and other CMOS circuits, when provided with a signal that is between a logical high and a logical low may enter into an undesirable high current consumption state. To protect such drivers and buffers, output gates 310 are placed between output buffers 311, 312 and 313 and switch array 200. Output gates 310 provide a high impedance input port to switch array 200 and a source of a logical signal for output buffer 311, 312 and 313.

Figure 4C:
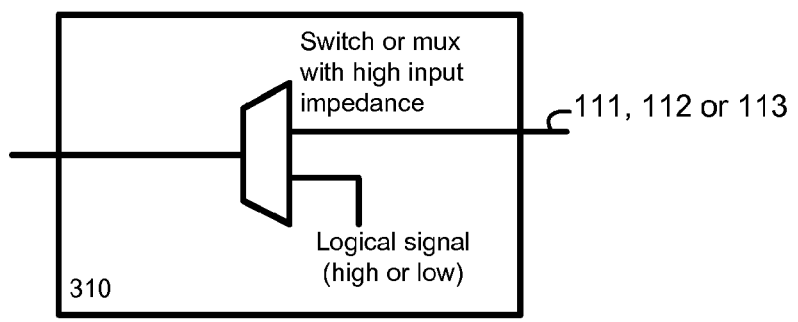

FIG. 4C shows an output gate 310. Output gate 310 may be formed with a logic gate (e.g., an AND gate or an OR gate) (not shown), a switch (not shown) or may be formed with a multiplexer (as shown). The multiplexer has the first input port to accept a signal from switch array 200, a second input port to accept a logical signal and an output port to provide an input signal to the output buffer (e.g., buffer 311). Switching between a normal operational mode and a low power mode may be provided by sleep mode control logic (550 in FIG. 5). In normal operation, gate 310 passes a signal from switch array 200 to output buffer 311. In a low power mode, gate 310 provides a logical signal to output buffer 311 thus alleviating the problem described above and inherent to many CMOS-type circuits. Gate 310 also provides a high impedance input port to switch array 200 during the low power mode. The high impedance input port allows the switch array 200 to float without being adversely effected by the circuitry within output gate 310.

Figure 5:
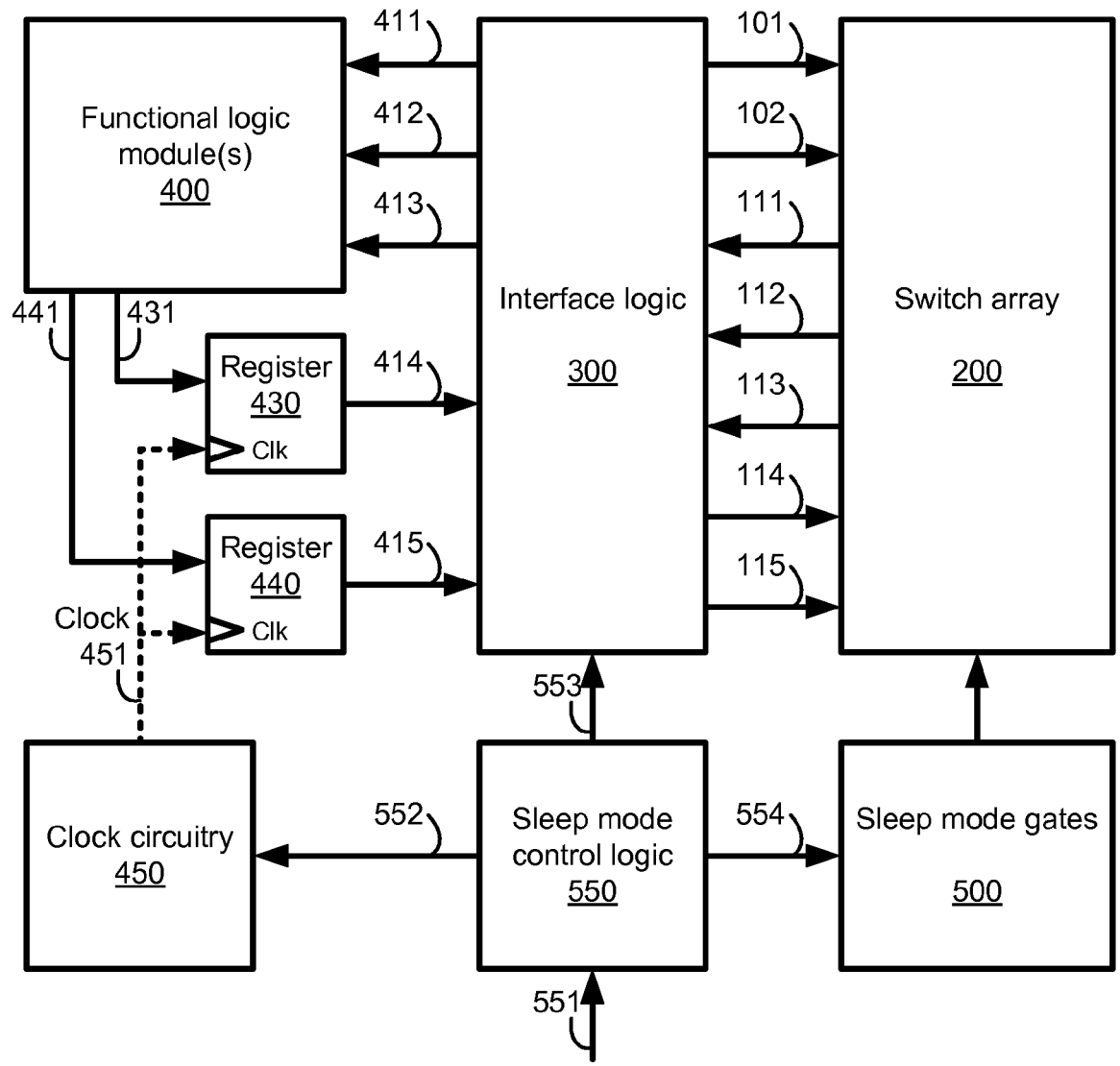

FIG. 5 shows interconnections among switch array 200, interface logic 300, functional modules 400, memory elements (such as registers 430 and 440), clock circuitry 450, optional sleep mode gates 500, and sleep mode control logic 550. As described above, switch array 200 accepts signals from interface logic 300 via lines 101, 102, 114 and 115. Switch array 200 provides signals to interface logic 300 via lines 111-113. Output terminals of interface logic 300 are coupled to inputs of functional module 400 via lines 411-413. Input terminals of interface logic 300 are coupled to outputs of functional module 400 via registers 430 and 440. For example, an output signal 431 of functional module 400 is provide to an input of register 430. One or more clock signal 451 provided by clock circuitry 450 latches signal 431 to an output terminal 414 of register 430. Register 430 may have additional control signal inputs to manipulate the output signal at output terminal 414. For example, register 430 may include a set control signal input terminal. When the set terminal is activated (e.g., by either a particular transition or a particular level), register 430 may produce an output signal at its output terminal 414 that represent a logical high. Similarly, register 430 may include a reset control signal input terminal that, when activated produces an output signal that represent a logical low. Similarly, an output signal 441 of functional module 400 is provide to an input of register 440, which may also have set and reset controls. Clock signal 451 latches signal 441 to an output terminal 415 of register 440.

Sleep mode control logic 550 is coupled to a control terminal of each gate of the pluralities of gates and may include an input terminal 551 to accept an active-mode/sleep-mode control signal. Sleep mode control logic 550 comprises control circuitry such as logic gates and registers and/or micro controller circuitry. Sleep mode control logic 550 performs a sequence of operations to coordinate enabling and disabling a control terminal of the plurality of gates. This coordinated control is described in more detail below. Sleep mode control logic 550 receives an input signal 551 and may provide one or more of output signals 552-554. Signals 551-554, if implemented, may be a single signal or may be one or more signals.

Control line 552 couples sleep mode control logic 550 to clock circuitry 450. When sleep mode control logic 550 sets control line 552 to a system-active state, an active clock signal 451 is provided to registers 430 and 440. When control line 552 is in a stand-by state, clock signal 451 is deactivate.

Control line 553 couples sleep mode control logic 550 to interface logic 300. When control line 553 is in a system-active state, interface logic 300 is allowed to pass signals from switch array 200 to functional module 400 or from registers 430 and 440 to switch array 200. Additionally, when control line 553 is in a system-active state, interface logic 300 provides logical low and logical high static signals to switch array 200. When control line 553 is in a stand-by state, interface logic 300 isolates switch array 200 from receiving external signals.

Some embodiments, for example as shown in FIG. 4A, also include sleep mode gates 500 and a control line 554 to control sleep mode gates 500. When control line 554 is in a system-active state, sleep mode gates 500 are decoupled from switch array 200. When control line 554 is in a stand-by state, columns and rows of switch array 200 are driven to a common potential, such as a common ground.

Figure 6A:
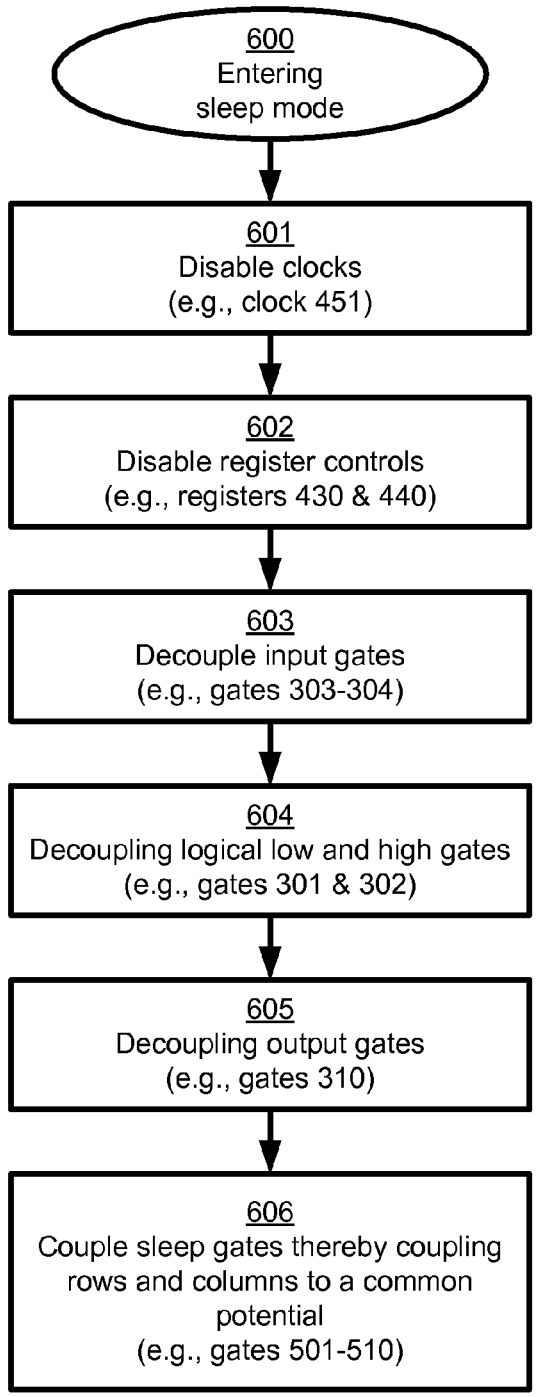
FIGS. 6A and 6B illustrate procedures for entering and exiting a sleep mode, in accordance with embodiments of the present invention.
Figure 6B:
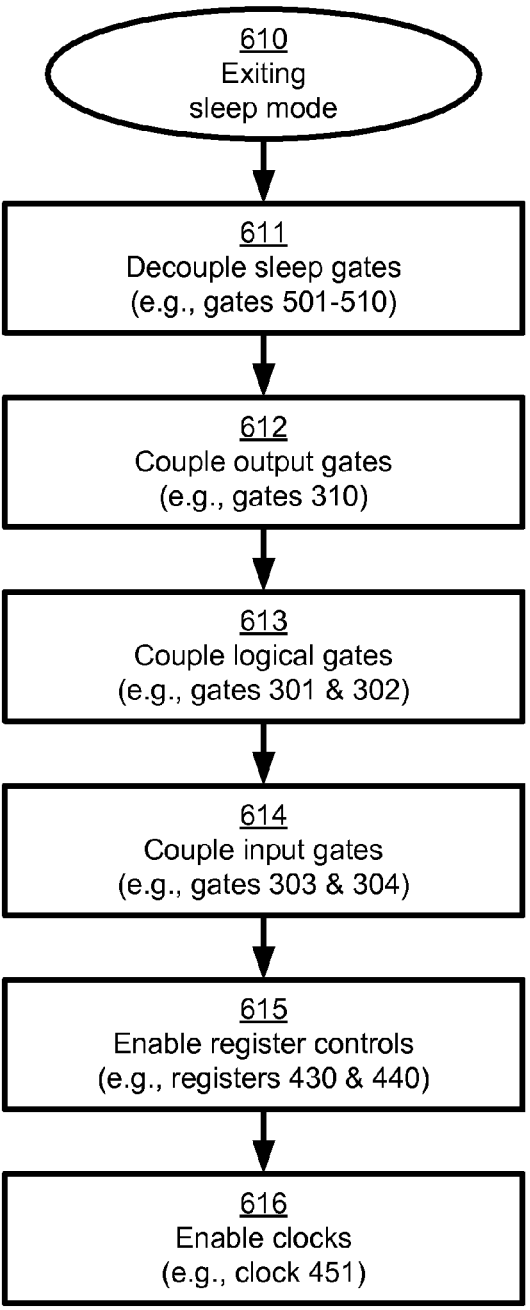

FIGS. 6A and 6B illustrate procedures for entering and exiting a standby or sleep mode, in accordance with embodiments of the present invention. FIG. 6A illustrates steps when transitioning from an active mode to a stand-by or sleep mode. Step 600 may begin when sleep mode control logic 550 receives a control signal 551 to enter a sleep mode.

At step 601, sleep mode control logic 550 initiates control signal 552 to control clock circuitry 450. Clock circuitry 450 disables transitions on clock signal 451 supplied to a plurality of registers 430 and 440 thereby stopping the new data from being latched to output gates of registers 430 and 440. By disabling the transition of clock 451, any spurious outputs from functional logic modules 400 are ignored and do not propagate through to switch array 200.

At step 602, register control signals (e.g., set and reset control signals) for registers (e.g., registers 430 and 440) are disabled. By disabling the register control signals, spurious changes to the register output signals may be avoided and thus do not propagate through to switch array 200.

At step 603, sleep mode control logic 550 uses control signal 553 to electrically decouple switch array 200 from registers 430 and 440 using input gates (e.g., gates 303-304) in interface logic 300.

At step 604, sleep mode control logic 550 also uses control signal 553 to electrically decouple logical low and logical high gates (e.g., gates 301 and 302) from switch array 200. At this point the rows and columns of switch array 200 are un-driven. That is, input signals are electrically decoupled from and not supplied to switch array 200.

Alternatively, one or more sources of a single common potential may be left coupled to switch array 200 thereby driving switch array 200 to the common potential. In some embodiments, switch array 200 may be left in a floating, un-driven state. However, a floating, un-driven line may supply a potential that is between a logical high and a logical low. As discussed above, such mid-potential signals may place CMOS circuitry in an undesirable high-current consumption state. To alleviate this problem, an input port to an output buffer may be keep in a low current consumption state and also be decoupled from switch array 200 by using an output gate, such as output gate 310.

At step 605, sleep mode control logic 550 may use control signal 553 and output gates (e.g., gates 310) to electrically decouple output buffers (e.g., buffers 311-313) from switch array 200. Additionally, control signal 553 may be use to provide a logical signal (either a logical high or a logical low) to an input of the output buffers (e.g., buffers 311-313).

At this point, if switch array 200 is decoupled from all input and output signals, it is floating. Alternatively, if switch array 200 has an input terminal coupled to a single common potential, it is driven to that common potential.

At step 606, if switch array 200 is un-driven by decoupling all input signals at steps 603 and 604, sleep mode control logic 550 uses control signal 554 to couple the columns of switch array 200 to a common potential via sleep gates 501-505. Also at step 606, sleep mode control logic 550 uses control signal 554 to couple the rows of switch array 200 to a common potential via sleep gates 506-510. By driving the switch terminals to a common potential, the potential across each un-programmed antifuse is a zero. Therefore, the leakage current across the antifuses is eliminated saving substantial power losses otherwise incurred in sleep mode. The coupling of rows and columns to the common potential may occur sequentially, in an overlapping manner or in any combination thereof.

FIG. 6B illustrates steps when transitioning from the sleep mode back to the active mode. Step 610 may begin when sleep mode control logic 550 receives a control signal to exit the sleep mode.

Step 611 reverses the step of 606. At step 611, sleep mode control logic 550 initiates control signal 554 to decouple the rows and columns of switch array 200 from the common potential via sleep gates 501-510. The decoupling of rows and columns from the common potential may occur sequentially, in an overlapping manner or any combination thereof. At this point the rows and columns of switch array 200 are again un-driven. That is, input signals and the common potential signal are electrically decoupled from and not supplied to switch array 200.

Step 612 reverses the step of 605. At step 612, output gates (e.g., gates 310) couple switch logic 200 to output buffers 311 to 313.

Step 613 reverses the step of 604. At step 613, sleep mode control logic 550 uses control signal 553 to electrically couple logical low and logical high gates (e.g., gates 301 and 302) to switch array 200.

Step 614 reverses the step of 603. At step 614, sleep mode control logic 550 also uses control signal 553 to electrically couple switch array 200 to registers 430 and 440 using input gates (e.g., gates 303-304) in interface logic 300. Steps 613 and 614 may occur sequentially in any order or may occur simultaneously.

Step 615 reverses the step of 602. At step 615, register controls (e.g., set and reset controls for registers 430 and 440) are enabled.

At step 616, which reverses the step of 601, sleep mode control logic 550 uses control signal 552 to control clock circuitry 450. Clock circuitry 450 enables transitions on clock signal 451 thereby allowing new data to be latched to output gates of registers 430 and 440. By enabling the transition of clock 451 and allowing changes to register outputs, functional logic modules 400 and switch array 200 may interoperate normally.

The steps described above may not all be performed in some embodiments. That is, in some embodiments, only a selected subset of steps 601-606 and 611-616 are performed. For example, any of steps 601 to 606 and 611-616 might not be performed. Execution of steps 601 to 605, if implemented, may occur concurrently (i.e., overlapping execution), may occur sequentially in any order (i.e., non-overlapping execution), or may occur in any various combination of concurrent and sequential operations. Furthermore, step 606 may occur concurrently with any of steps 601 to 605 or may occur after steps 601 to 605. Similarly, step 611 may be performed before or concurrently with any of steps 612 to 616. In addition, steps 612 to 616, if performed, may be executed concurrently or sequentially (in any order), or may be performed in a combination of concurrent and sequential steps.

The description above provides various hardware embodiments of the present invention. Furthermore, the figures provided are merely representational and may not be drawn to scale. Certain proportions thereof may be exaggerated, while others may be minimized. The figures are intended to illustrate various implementations of the invention that can be understood and appropriately carried out by those of ordinary skill in the art. Therefore, it should be understood that the invention can be practiced with modification and alteration within the spirit and scope of the claims. The description is not intended to be exhaustive or to limit the invention to the precise form disclosed. It should be understood that the invention can be practiced with modification and alteration. For example, the invention applies to other switches such as transistor based switches, (e.g., FLASH, EEPROM and/or SRAM) or other devices exhibiting a leakage current, especially during a sleep or stand-by mode.

What is claimed is:

1. A programmable logic device comprising:
   (a) a switch array comprising a plurality of switches each having a first terminal coupled to one of a plurality of columns and a second terminal couple to one of a plurality of rows, wherein the switch array is for interconnecting input and output lines of functional logic modules;
   (b) interface logic comprising input logic operable to provide one or more signals to the switch array, wherein the input logic comprises
   a first plurality of gates having a first terminal coupled to one or more of the plurality of switches; and
   an associated plurality of input buffers each one coupled to a second terminal of a respective one of the first plurality of gates;
   (c) sleep mode gates comprising
   a second plurality of gates each one having a first terminal coupled to a respective one of the plurality of columns and having a second terminal coupled to a common potential source; and
   a third plurality of gates each one having a first terminal coupled to a respective one of the plurality of rows and having a second terminal coupled to the common potential source; and
   (d) sleep mode control logic coupled to a control terminal of each gate of the first, second and third pluralities of gates.

2. The programmable logic device of claim 1, wherein the interface logic further comprises a fourth plurality of gates comprising:
   a first gate comprising
   a first terminal coupled a source of a logical low signal; and
   a second terminal coupled to a single one of the plurality of columns and rows; and
   a second gate comprising
   a first terminal coupled a source of a logical high signal; and
   a second terminal coupled to a single one of the plurality of columns and rows.

3. The programmable logic device of claim 1, wherein the interface logic further comprises a plurality of output buffers coupled to one or more of the plurality of switches, wherein each of the plurality of output buffers is operable to accept a signal from the switch array.

4. The programmable logic device of claim 1, wherein each switch of the plurality of switches comprises an antifuse switch.

5. The programmable logic device of claim 1, wherein each switch of the plurality of switches comprises a transistor based switch.

6. The programmable logic device of claim 1, further comprising:
   (e) one or more memory elements; and
   (f) one or more functional logic modules;
   wherein each of the memory elements is coupled to an output of the functional logic modules and also coupled to a buffer from the plurality of input buffers.

7. The programmable logic device of claim 6, wherein each of the one or more memory elements comprise a register.

8. The programmable logic device of claim 1, wherein the sleep mode control logic is further coupled to a control terminal of clock circuitry.

9. The programmable logic device of claim 1, further comprising:
   (e) a plurality of memory elements each coupled to a respective one of the plurality of input buffers; and
   (f) clock circuitry coupled to the plurality of memory elements;
   wherein the sleep mode control logic is further coupled to a control terminal of the clock circuitry.

10. The programmable logic device of claim 9, wherein each of the one or more memory elements comprise a register.

11. The programmable logic device of claim 1, wherein the sleep mode control logic comprises control circuitry.

12. The programmable logic device of claim 1, wherein the sleep mode control logic comprises a set of logic gates.

13. The programmable logic device of claim 1, wherein the sleep mode control logic comprises logic to perform a sequence of operations comprising:
   electrically decoupling the first terminal from the second terminal using the control terminal for each of the first plurality of gates; and
   electrically coupling the first terminal to the second terminal using the control terminal of the second and third pluralities of gates.

14. The programmable logic device of claim 13, wherein the sequence of operations further comprises disabling one or more clock signals.

15. The programmable logic device of claim 13, wherein the sequence of operations further comprises:
   electrically decoupling the first terminal from the second terminal using the control terminal of the second and third pluralities of gates; and
   electrically coupling the first terminal to the second terminal using the control terminal for each of the first plurality of gates.

16. The programmable logic device of claim 15, wherein the sequence of operations further comprises enabling one or more clock signals.

17. The programmable logic device of claim 13, wherein the sequence of operations further comprises electrically decoupling a first terminal from a second terminal for each of a fourth plurality of gates, wherein the fourth plurality of gates comprises:
   a first gate comprising
      a first terminal coupled a source of a logical low signal; and
      a second terminal coupled to a single one of the plurality of columns and rows; and
   a second gate comprising
      a first terminal coupled a source of a logical high signal; and
      a second terminal coupled to a single one of the plurality of columns and rows.

18. The programmable logic device of claim 17, wherein the sequence of operations further comprises electrically coupling the first terminal to the second terminal for each of the fourth plurality of gates.

19. A method of processing a sleep mode, the method comprising:
   (a) receiving a control signal to enter a sleep mode;
   (b) electrically decoupling input logic from a switch array with a first plurality of gates, wherein the switch array comprises a plurality of switches each having a first terminal coupled to one of a plurality of columns and a second terminal couple to one of a plurality of rows, and wherein the input logic is operable to provide one or more signals to the switch array, wherein the switch array is for interconnecting input and output lines of functional logic modules;
   (c) electrically coupling a first terminal to a second terminal for each of a second plurality of gates, wherein the first terminal is coupled to a respective one of the pluralities of columns and wherein the second terminal is coupled to a common potential source; and
   (d) electrically coupling a first terminal to a second terminal for each of a third plurality of gates, wherein the first terminal is coupled to a respective one of the pluralities of rows and wherein the second terminal is coupled to the common potential source.

20. The method of claim 19, further comprising
   (e) disabling a clock signal coupled to a plurality of memory elements.

21. The method of claim 19, further comprising:
   (f) electrically decoupling a first terminal from a second terminal for each of a fourth plurality of gates, wherein the fourth plurality of gates comprises a first gate comprising a first terminal coupled a source of a logical low signal, and a second terminal coupled to a single one of the plurality of columns and rows, and wherein the fourth plurality of gates further comprises a second gate comprising a first terminal coupled a source of a logical high signal and a second terminal coupled to a single one of the plurality of columns and rows.

22. The method of claim 21, wherein the acts of (f) electrically decoupling the first terminal from the second terminal of the fourth plurality of gates and (b) electrically decoupling the input logic from the switch array with the first plurality of gates are overlapping acts.

23. The method of claim 19, further comprising:
   (g) receiving a control signal to exit the sleep mode;
   (h) electrically decoupling the first terminal from the second terminal for each of the third plurality of gates; and
   (i) electrically decoupling the first terminal from the second terminal for each of the second plurality of gates; and
   (j) electrically coupling the switch array to the input logic using the first plurality of gates.

24. The method of claim 23, further comprising:
   (k) enabling a clock signal coupled to a plurality of memory elements.

25. The method of claim 23, further comprising:
   (l) electrically coupling a first terminal to a second terminal for each of a fourth plurality of gates, wherein the fourth plurality of gates comprises a first gate comprising a first terminal coupled a source of a logical low signal, and a second terminal coupled to a single one of the plurality of columns and rows, and wherein the fourth plurality of gates further comprises a second gate comprising a first terminal coupled a source of a logical high signal and a second terminal coupled to a single one of the plurality of columns and rows.

26. The method of claim 24, wherein the acts of (l) electrically coupling the first terminal to the second terminal of the fourth plurality of gates and (j) electrically coupling the switch array to the input logic using the first plurality of gates are overlapping acts.

* * * * *

UNITED STATES PATENT AND TRADEMARK OFFICE
CERTIFICATE OF CORRECTION

PATENT NO. : 7,646,216 B2  Page 1 of 1
APPLICATION NO. : 11/563632
DATED : January 12, 2010
INVENTOR(S) : Shiao et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 517 days.

Signed and Sealed this

Sixteenth Day of November, 2010

David J. Kappos
*Director of the United States Patent and Trademark Office*